US009243324B2

(12) United States Patent
Bowen et al.

(10) Patent No.: US 9,243,324 B2
(45) Date of Patent: Jan. 26, 2016

(54) METHODS OF FORMING NON-OXYGEN CONTAINING SILICON-BASED FILMS (71) Applicant: AIR PRODUCTS AND CHEMICALS, INC., Allentown, PA (US)

(72) Inventors: Heather Regina Bowen, Vista, CA (US); Jianheng Li, Breinigsville, PA (US); Mark Leonard O'Neill, San Marcos, CA (US); Manchao Xiao, San Diego, CA (US); Andrew David Johnson, Doylestown, PA (US); Xinjian Lei, Vista, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 26 days.

(21) Appl. No.: 13/949,420

(22) Filed: Jul. 24, 2013

(65) Prior Publication Data

US 2014/0030448 A1    Jan. 30, 2014

Related U.S. Application Data (60) Provisional application No. 61/677,267, filed on Jul. 30, 2012.

(51) Int. Cl.
*C23C 16/30*    (2006.01)
*C23C 16/32*    (2006.01)
*C23C 16/36*    (2006.01)

(52) U.S. Cl.
CPC ............... *C23C 16/30* (2013.01); *C23C 16/325* (2013.01); *C23C 16/36* (2013.01)

(58) Field of Classification Search
CPC .... C23C 16/30; C23C 16/325; C23C 16/345; C23C 16/36
USPC ............................ 427/255.31, 255.393, 578
See application file for complete search history.

(56) References Cited

U.S. PATENT DOCUMENTS

| | | | | |
|---|---|---|---|---|
| 4,863,755 A * | 9/1989 | Hess et al. | | 427/574 |
| 4,923,716 A | 5/1990 | Brown et al. | | |
| 5,204,141 A | 4/1993 | Roberts et al. | | |
| 5,744,196 A | 4/1998 | Laxman et al. | | |
| 6,448,187 B2 | 9/2002 | Yau et al. | | |
| 6,511,909 B1 * | 1/2003 | Yau et al. | | 438/638 |
| 6,743,737 B2 | 6/2004 | Yau et al. | | |
| 6,858,548 B2 | 2/2005 | Won et al. | | |
| 7,651,725 B2 | 1/2010 | Yau et al. | | |
| 7,745,328 B2 | 6/2010 | Yim et al. | | |
| 7,875,556 B2 * | 1/2011 | Xiao et al. | | 438/739 |
| 7,972,975 B2 | 7/2011 | Dussarrat | | |
| 8,846,546 B2 | 9/2014 | Takeda | | |
| 2003/0194496 A1 | 10/2003 | Xu et al. | | |
| 2005/0233555 A1 * | 10/2005 | Rajagopalan et al. | | 438/483 |
| 2006/0008661 A1 | 1/2006 | Wijesundara et al. | | |
| 2006/0258173 A1 * | 11/2006 | Xiao et al. | | 438/780 |
| 2009/0093132 A1 | 4/2009 | Xu et al. | | |
| 2010/0130025 A1 | 5/2010 | Dussarrat | | |
| 2010/0143609 A1 | 6/2010 | Fukazawa et al. | | |
| 2010/0233886 A1 | 9/2010 | Yang et al. | | |
| 2011/0165346 A1 | 7/2011 | Xiao et al. | | |
| 2011/0262642 A1 * | 10/2011 | Xiao et al. | | 427/255.394 |
| 2011/0275507 A1 | 11/2011 | Dussarrat | | |
| 2012/0003819 A1 | 1/2012 | Francis et al. | | |
| 2012/0128897 A1 * | 5/2012 | Xiao et al. | | 427/579 |
| 2013/0095414 A1 * | 4/2013 | Yoo et al. | | 430/5 |
| 2013/0129940 A1 * | 5/2013 | Xiao et al. | | 427/578 |
| 2013/0230986 A1 | 9/2013 | Rajagopalan et al. | | |

FOREIGN PATENT DOCUMENTS

| | | |
|---|---|---|
| JP | 9503822 | 4/1997 |
| JP | 2009170872 | 7/2009 |
| JP | 2011040741 | 2/2011 |
| JP | 2011228717 | 11/2011 |
| JP | 2012025733 | 2/2012 |
| JP | 2013502714 | 1/2013 |
| KR | 1020130044140 | 5/2013 |
| WO | 9510638 A1 | 4/1995 |
| WO | 2011038995 A1 | 4/2011 |

OTHER PUBLICATIONS

Kessels, W.M.M., et al., "Temperature dependence of the surface reactivity of SiH3 radicals and the surface silicon hydride composition during amorphous silicon growth". Surface Science Letters, 547 (2003) L865-L870.*
Kessels, W.M.M., et al., "Improvement of hydrogenated amorphous silicon properties with increasing contribution of SiH3 to film growth". J. Vac. Sci. Technol. A 19(3), May/Jun. 2001, pp. 1027-1029.*
Loboda, M.J., et al., "Plasma-enhanced chemical vapor deposition of a-SiC:H films from organosilicon precursors". J. Vac. Sci. Technol. A 12(1), Jan./Feb. 1994, pp. 90-96.*
Schmidbaur, Hubert, et al., "Die unterschiedliche Reaktivitat von 1,4-Disilabutan und n-Tetrasilan gegenuber sekundaren Aminen". Zeitschrift Fur Naturforschung B: Chemical Sciences, vol. 45, No. 12, 1990, pp. 1679-1683.*
Elvira A. Volinina, et al.; "Si/C Phases from the IR laser-induced decomposition of 1,4-disilabutane"; Journal of Materials Chemistry; vol. 7, No. 4, Jan. 1, 1997; pp. 637-640.
T. H. Kunstamann, et al.; "Novel brominated carbosilane precursors for low-temperature heteroepitaxy of .beta.-SiC and their comparison with methyltrichlorosilane"; Chemistry of Materials, vol. 7, No. 9, Sep. 1, 1995, pp. 1675-1679.
Disclosed Anonomously; IP.com Journal; "Low Temperature Deposition of SixNyhz Using BTBAS and Alkylsilanes and Alhyldisilanes"; Jun. 13, 2008.
European Search Report—Dated Oct. 8, 2013; EP Application No.—EP 13 17 8623.
Disclosed Anonymously, Extra Low-Temperature SiC Deposition, IP.com, IP.com No. IPCOM000168604D, Mar. 18, 2008.
Method of depositing a thin film on a semiconductor substrate, IP.com No. IPCOM000172513D, Jul. 10, 2008.

* cited by examiner

*Primary Examiner* — Bret Chen
(74) *Attorney, Agent, or Firm* — Rosaleen P. Morris-Oskanian (57) ABSTRACT

Methods for forming non-oxygen containing silicon-based films, that contain >50 atomic % of silicon, are provided herein. In one aspect, the silicon-based films have a composition SixCyNz wherein x is about 51 to 100, y is 0 to 49, and z is 0 to 50 atomic weight (wt.) percent (%) as measured by XPS. In one embodiment, the non-oxygen silicon-based films were deposited using at least one organosilicon precursor having at least two $SiH_3$ groups with at least one $C_{2-3}$ linkage between silicon atoms such as 1,4-disilabutane.

22 Claims, 1 Drawing Sheet

METHODS OF FORMING NON-OXYGEN CONTAINING SILICON-BASED FILMS

CROSS REFERENCE TO RELATED APPLICATION

The present patent application claims the benefit of prior U.S. Provisional Patent Application Ser. No. 61/677,267 filed Jul. 30, 2012.

BACKGROUND OF THE INVENTION

Disclosed herein are silicon-containing or silicon-based films, that are non-oxygen containing or substantially free of oxygen, and methods of forming the same. The silicon-based films described herein include, but not limited to, non-stoichiometric silicon carbide, silicon carbonitride, silicon nitride or amorphous silicon for use in various electronic applications.

Other elements besides silicon may be present in the non-oxygen containing silicon-based films. These other elements may sometimes be intentionally added into the compositional mixture via deposition process depending upon the resultant application of the film or desired end-properties. For example, the element nitrogen (N) may be added to the silicon-based films to form a carbonitride, or silicon nitride film that may provide a certain dielectric performance such as lower leakage current. Depending upon the application, however, certain elements in the film may be undesirable even at lower concentration levels.

The reference, IPCOM000172513D entitled "Method of depositing a thin film on a semiconductor substrate" disclosed non-limiting embodiments of a device and a process for depositing a film on a substrate for semiconductor manufacturing applications are described. The reference describes using one or more of the following precursors, trisilylamine (TSA), 1,4-disilabutane (1,4-DSB) and ammonia ($NH_3$), to obtain a SixCyNz film in a LPCVD reactor at 2-5 Torr/400-550° C. This embodiment has low temperature deposition (below 550° C.), high vapor pressure of precursors and the ability to tune carbon content by changing the reactants/ratios.

The reference IPCOM000168604D entitled "Extra Low-Temperature SiC Deposition" disclosed the deposition of SiC thin films at low temperature (<500° C.) in a thermal CVD regime. The SiC source is an organosilane with nitrogen as a dilution gas. The organosilane gases are Si-substituted alkanes such as disilabutane (e.g., 1,3-disilabutane) and trisilaheptane (e.g., 2,4,6-trisilaheptane).

U.S. Pat. No. 4,923,716 ("the '716 Patent") described the deposition of SiC by chemical vapor deposition from a vapor source containing both Si and C in a single molecular species. The molecular species has general formula $C_nSi_nH_m$ where m ranges from 2n+1 to 4n+2 inclusive and n=2-6 inclusive, and exhibits a primary pyrolysis mechanism producing reactive fragments containing both Si and C atoms. The Si and C atoms are co-deposited onto the substrates in equal numbers and at equal rates producing stoichiometrically deposited SiC.

U.S. Pat. No. 7,651,725 ("the '725 Patent") disclosed a method and apparatus for depositing a low dielectric constant film by reaction of an organosilicon compound and an oxidizing gas at a constant RF power level from about 10 W to about 200 W or a pulsed RF power level from about 20 W to about 500 W. The '725 Patent teaches that carbon such as some organo functional groups remain in the oxidized organo silane layer which contribute to low dielectric constants and excellent barrier properties.

U.S. Pat. No. 7,972,975 and US Publ. No. 2011/275507 disclosed the deposition of dielectric layers with a low dielectric constant, said layers being used to separate metallic interconnections especially during the production of integrated circuit boards (in the BEOL part of the circuit). The dielectric layer comprises low dielectric constant SiC and/or SiOC, and is obtained from at least one precursor comprising at least one "Si—"C"n-Si chain where n=1.

US Publ. No. 2010/0143609 disclosed a method of forming a low-carbon content, Si-containing film by CVD on a substrate having trenches includes: introducing a Si-containing compounds having 3 hydrocarbon units in its molecules and having a boiling temperature of 35-220° C.; applying RF power to the gas; and depositing a film on a substrate having trenches wherein the substrate is controlled at a temperature such that components of the Si-containing compound are at least partially liquefied on the substrate, thereby filling the trenches with the film.

U.S. Pat. No. 6,858,548 disclosed a process for depositing a low dielectric constant layer (k<3) on a flat panel display and a flat panel display. The process included reacting one or more organosilicon compound with an oxygen containing compound at an RF power level from about 0.345-1.265 $W/cm^2$. The flat panel display included a plasma display panel having a first substrate, a plurality of barriers deposited on the first substrate, a second substrate, a low dielectric constant layer (k<3) deposited on the second substrate, and a plurality of ground electrodes formed between the barriers and the dielectric layer.

US Publ. No. 2003/0194496 disclosed methods for depositing a low dielectric constant material. In one aspect, the reference described a method for depositing a low dielectric constant material including introducing a processing gas comprising H and an O-containing organosilicon compound, an O-free organosilicon compound, or combinations thereof, to a substrate surface in a processing chamber and reacting the processing gas at processing conditions to deposit the low dielectric constant material on the substrate surface, in which the low k dielectric material comprises at least Si and C. The processing gas may further include an inert gas, a meta-stable compound, or combinations thereof. The method may further include treating the low dielectric constant material with a H-containing plasma, annealing the deposited low dielectric constant material, or combinations thereof.

US Publ. No. 2010/233886 described methods of forming silicon-based films comprising Si, such as, but not limited to, Si oxide, Si oxycarbide, Si carbide, and combinations thereof, that exhibit at least one of the following characteristics: low wet etch resistance, a dielectric constant of 6.0 or below, and/or can withstand a high temperature, rapid thermal anneal process. The methods employ a Si-containing precursor having the formula $R1_3Si$—$R_2$—$SiR_3$ such as, for example 1,4-disilabutane, and an O source which is provided in a molar amount less than a 1:1 ratio to the Si precursor.

U.S. Pat. Nos. 6,448,187 and 6,743,737 disclosed a method and apparatus for depositing a low dielectric constant film includes depositing a silicon oxide based film, preferably by reaction of an organosilicon compound and an oxidizing gas at a low RF power level from about 10 W to about 500 W, exposing the silicon oxide based film to water or a hydrophobic-imparting surfactant such as hexamethyldisilazane, and curing the silicon oxide based film at an elevated temperature.

U.S. Pat. No. 7,745,328 disclosed a method of forming low-k dielectric barrier films with oxygen doping by plasma-enhanced chemical vapor deposition (PECVD). A silicon carbide layer having significantly reduced current leakage is deposited onto a substrate. The silicon carbide layer serves as a barrier layer or part of a barrier bilayer that also includes a barrier layer.

BRIEF SUMMARY OF THE INVENTION

Described herein are methods of forming non-oxygen containing silicon materials or films comprising silicon, carbon, optionally nitrogen, and combinations thereof that are substantially free of oxygen, or, alternatively, comprises from about 0 to about 2 atomic weight percent of oxygen as measured by X-ray photoelectron spectroscopy (XPS). In one aspect, the silicon-based films have a composition $Si_xC_yN_z$ wherein x is about 51 to 100, y is 0 to 49, and z is 0 to 50 atomic weight (wt.) percent (%) as measured by XPS. In another aspect, the silicon-based films have a composition $Si_xC_y$ wherein x is about 51 to 99 and y is about 1 to about 25 atomic wt. %. The non-oxygen silicon-based films described herein contain greater than 50 atomic wt. % of silicon as measured by X-ray photoelectron spectroscopy (XPS). The atomic wt. % of carbon and nitrogen in the non-oxygen silicon-based films can be tuned by changing deposition conditions such as temperature, adding a nitrogen source, or combinations thereof while maintaining a greater than 50 atomic wt. % of silicon in the material or film.

In one aspect, there is provided a method for forming a non-oxygen silicon-based film on at least one surface of a substrate, the method comprising:

providing at least one surface of the substrate in a reaction chamber;

providing at least one organosilicon precursor having at least two $SiH_3$ groups with at least one $C_{2-3}$ linkage between silicon atoms in the reaction chamber; and forming the non-oxygen silicon-based film on the at least one surface by a deposition process selected from a group consisting of chemical vapor deposition (CVD), low pressure chemical vapor deposition (LPCVD), plasma enhanced chemical vapor deposition (PECVD), cyclic chemical vapor deposition (CCVD), plasma enhanced cyclic chemical vapor deposition (PECCVD, atomic layer deposition (ALD), and plasma enhanced atomic layer deposition (PEALD) wherein the non-oxygen silicon-based film comprise from about 51 to about 99 atomic weight percent silicon as measured by XPS. In one aspect, the deposition process comprises LPCVD. In another aspect, the deposition process comprises PECVD.

In another aspect, there is provided a method for forming a non-oxygen silicon-based film having the formula $Si_xC_yH_z$ wherein x is about 51 to 100, y is 0 to 50, and z is 0 to 50 atomic weight (wt.) percent (%) as measured by XPS on at least one surface of a substrate, the method comprising:

providing at least one surface of the substrate in a reaction chamber;

providing at least one organosilicon precursor having at least two $SiH_3$ groups with at least one $C_{2-3}$ linkage between silicon atoms in the reaction chamber; and optionally providing a nitrogen-containing precursor selected from the group consisting of ammonia, hydrazine, monoalkylhydrazine, dialkylhydrazine, primary amine, secondary amine, tertiary amine, and mixture thereof in the reaction chamber; and forming the non-oxygen silicon-based film on the at least one surface by a deposition process comprising low pressure chemical vapor deposition (LPCVD). In certain embodiments, the LPCVD deposition is conducted at one or more temperatures ranging from about 200 to about 600° C. In these or other embodiments, the atomic wt. % of carbon and nitrogen in the non-oxygen silicon-based films can be adjusted by changing the LPCVD deposition conditions such as temperature, adding a nitrogen-containing precursor, or combinations thereof. In embodiments wherein a nitrogen-containing precursor is used, a flow ratio (R) of the amount of nitrogen-containing precursor to the amount of the at least one organosilicon precursor ranges from 0.25 to 20 LPCVD processes.

In a further aspect, there is provided a method for forming a non-oxygen silicon-based film on at least one surface of a substrate, the method comprising:

providing at least one surface of the substrate in a reaction chamber;

providing at least one organosilicon precursor having at least two $SiH_3$ groups with at least one $C_{2-3}$ linkage between silicon atoms in the reaction chamber;

optionally providing a nitrogen-containing precursor selected from the group consisting of ammonia, hydrazine, monoalkylhydrazine, dialkylhydrazine, primary amine, secondary amine, tertiary amine, and mixture thereof in the reaction chamber; and forming the non-oxygen silicon-based film on the at least one surface by a deposition process comprising plasma enhanced chemical vapor deposition (PECVD), wherein the non-oxygen silicon-based film comprise from about 51 to about 99 atomic weight percent silicon as measured by XPS. In embodiments wherein a nitrogen-containing precursor is used, a flow ratio (R) of the amount of nitrogen-containing precursor to the amount of the at least one organosilicon precursor ranges from 0.25 to 20 LPCVD, or wherein the R is equal to or less than 1.

In yet another aspect, there is described a vessel used to deliver a precursor for the depositing a non-oxygen silicon-based film comprising: at least one organosilicon precursor having at least two $SiH_3$ groups with at least one $C_{2-3}$ linkage between silicon atoms. In one particular embodiment, the vessel comprises at least one pressurizable vessel (preferably of stainless steel) fitted with the proper valves and fittings to allow the delivery of one or more precursors to the reaction chamber for the deposition processes. The at least one organosilicon precursor having at least two $SiH_3$ groups with at least one $C_{2-3}$ linkage between silicon atoms, such as without limitation a $C_2$ linkage, is selected from the group consisting of

DETAILED DESCRIPTION OF THE INVENTION

Described herein are silicon-based films, and methods for forming the same that are substantially free of oxygen. The term "substantially free" as used herein means a film that comprises 2 atomic weight % or less of oxygen as measured by XPS. The non-oxygen containing silicon-based films exhibit at least one or more of the following characteristics: relatively lower wet etch rate as compared to thermal silicon oxide (such as when exposed to dilute HF), lower leakage current, good within wafer uniformity which uniformity can be obtained by measurement on different areas of the wafers (e.g. 5 point map) and standard deviation calculation, conformality, resistance to gas phase processes (such as, for example, oxidative plasmas), and combinations thereof. With regard to the later characteristics, the non-oxygen containing silicon-based films exhibits relatively little to no change in properties and film structure compared to thermal silicon oxide.

Also described herein is the use of organosilicon compounds having at least two $SiH_3$ groups with at least one $C_{2-3}$ linkage between silicon atoms, preferably $C_2$ linkage, such as ethylene bridge, as the precursors to deposit the non-oxygen containing films which are substantially free of or contain 2 atomic weight % or less as measured by XPS oxygen. The $C_{2-3}$ linkage is a diradical chain selected from the group consisting of an alkane-1,2-diyl, an alkane-1,3-diyl, cyclic alkane-1,2-diyl, and cyclic alkane-1,3-diyl. Examples of alkane-1,2-disyl and alkane-1,3-diyl include, but not limited to, ethylene (—$CH_2CH_2$—), substituted ethylene (—$CHMeCH_2$—, —CH(Me)CH(Me)-), propylene (—$CH_2CH_2CH_2$—), and substituted propylene. Examples of cyclic alkane-1,2-diyl and cyclic alkane-1,3-diyl include cyclohexane-1,2-diyl, cyclohexane-1,3-diyl, cyclopentane-1,2-diyl, cyclopentane-1,3-diyl. Examples of the organosilicon precursors include 1,4-disilabutane ("1,4-DSB") and other organosilicon compounds with similar structures. Silicon-based films deposited from the precursors have shown to have unique film properties, such as being silicon-rich (e.g., have greater than 50 atomic % of Si), and the ability to adjust the Si, C, in silicon carbide films or to tune Si, C, and N content in silicon carbonitride.

To form dielectric films comprising silicon, carbon, and optionally nitrogen that are substantially oxygen free, it is desirable that the organosilicon precursor is free of oxygen. It is also desirable, in certain embodiments, that the precursors be reactive enough to deposit a film at a relatively low temperature (e.g., 600° C. or less). Despite a desire for precursor reactivity, the precursor must also be stable enough to not degrade or change to any significant extent over time (e.g., less than 1% change per year). Not being bound to theory, the organosilicon compounds, such as 1,4-disilabutane, described herein which comprise an ethylene bridge between silicon atoms exhibit a special tendency to cleave the C—Si bonds at a high temperature deposition temperature (e.g., about 450° C. or greater). When one silicon group breaks from ethylene bridge, a free radical or a cation is formed on the bridge-head carbon atom. Another silicon placed on the β-position provides stabilization to the radical or cation through hyperconjugation or is a filled σ-orbital of Si—C bond which donates electrons to the empty or single occupancy p-orbital. This is also known as β-silicon effect. This hyperconjugated intermediate further decomposes with the breakage of the second Si—C bond. The net result is the elimination of ethylene bridge as volatile byproduct, and the generation of chemically reactive silicon species, which subsequently reacts with each other to deposit the non silicon-based films described herein on the substrate. The silicon-based films described herein do not contain detectable oxygen and are stable to ambient degradation (such as oxidation, hydrolysis, etc.) over time such as the shown by the data provided in Example 1 herein. Further, the silicon-based films are silicon-rich or have greater than about 50 atomic wt. % as measured by XPS silicon.

Below are non-limited examples of the organosilicon compounds having at least two $SiH_3$ groups with at least one $C_{2-3}$ linkage, preferably $C_2$ linkage, between silicon atoms:

1,4,7-trisilaheptane

-continued

The non-oxygen containing silicon-based films, materials, or coatings are formed via deposition processes. Examples of suitable deposition processes for the method disclosed herein include, but are not limited to, low-pressure chemical vapor deposition (LPCVD), cyclic CVD (CCVD), MOCVD (Metal Organic CVD), thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, CVD of a liquid polymer precursor, deposition from supercritical fluids, and low energy CVD (LECVD). In one aspect, the deposition process comprises LPCVD. In another aspect, the deposition process comprises PECVD.

In certain embodiments, the metal containing films are deposited via plasma enhanced ALD (PEALD) or plasma enhanced cyclic CVD (PECCVD) process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits conformal films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the silicon-based film is deposited using an ALD process. In another embodiment, the silicon-based film is deposited using a CVD process. In a further embodiment, the silicon-based film is deposited using a thermal CVD process.

Depending upon the deposition method, in certain embodiments, the one or more silicon-based precursors may be introduced into the reactor at a predetermined molar volume, or from about 0.1 to about 1000 micromoles. In this or other embodiments, the silicon-based precursor may be introduced into the reactor for a predetermined time period, or from about 0.001 to about 500 seconds.

The deposition methods disclosed herein may involve one or more purge gases. The purge gas, which is used to purge away unconsumed reactants and/or reaction byproducts, is an inert gas that does not react with the precursors. Exemplary inert gases include, but are not limited to, Ar, $N_2$, He, neon, $H_2$ and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

In certain embodiments, the organosilicon precursor is introduced neat, or without additional reactants or carrier gas, under certain deposition conditions to form a solid. In this or other embodiments, a flow of argon and/or other gas may be employed as a carrier gas to help deliver the vapor of the at least one silicon-based precursor to the reaction chamber during the precursor pulsing.

The at least one silicon precursors may be delivered to the reaction chamber such as a cyclic CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

The deposition temperature in the reaction chamber ranges from 100° C. to 600° C. Exemplary deposition temperatures include one or more of the following endpoints: 100° C., 150° C., 200° C., 250° C., 300° C., 350° C., 400° C., 450° C., 500° C., 550° C., and 600° C. Examples of suitable ranges of deposition temperature(s) include without limitation, 100° C. to 400° C., 200° to 450° C., or 300° to 600° C.

In certain embodiments, the pressure during the deposition process within the reaction chamber ranges from about 0.5 to about 6 Torr, or from about 2 to about 4 Torr, or from about 3 to about 5 Torr. For a PECVD deposition process, the pressure during the deposition process may range from about 2 to about 6 Torr. For a LPCVD deposition process, the pressure during the deposition process may range from about 0.25 is about 1.25 Torr or about 1 Torr.

Energy is applied to the at least one of the precursor, other non-oxygen sources, reducing agent, other precursors or combination thereof to induce reaction and to form the silicon-based film or coating on the substrate. Such energy can be provided by, but not limited to, thermal, plasma, pulsed plasma, helicon plasma, high density plasma, inductively coupled plasma, X-ray, e-beam, photon, and remote plasma methods. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

In a typical ALD or CVD process, the substrate such as a silicon oxide substrate is heated on a heater stage in a reaction chamber that is exposed to the silicon-based precursor initially to allow the complex to chemically adsorb onto the surface of the substrate.

It is understood that the steps of the methods described herein may be performed in a variety of orders, may be performed sequentially or concurrently (e.g., during at least a portion of another step), and any combination thereof. The respective step of supplying the precursors and the other source gases (N-source; C-source) may be performed by varying the duration of the time for supplying them to change the stoichiometric composition of the resulting silicon-based film.

For multi-component silicon-based films, at least one of other precursors such as silicon-based precursors, nitrogen-containing precursors, reducing agents, or other reagents can be alternately introduced into the reactor chamber.

The nitrogen-containing precursors can be selected from the group consisting of ammonia, hydrazine, monoalkylhydrazine, dialkylhydrazine, primary amine, secondary amine, tertiary amine and mixture thereof. Exemplary monoalkylhydrazine includes, but not limited, methylhydrazine, tert-butylhydrazing. Exemplary dialkyhydrazine includes, but not limited, 1,1-dimethylhydrazine. Exemplary primary amine includes, but not limited, methylamine, ethylamine, iso-propylamine, tert-butylamine. Exemplary secondary amine includes, but not limited, dimethylamine, diethylamine, di-iso-propylamine. Exemplary tertiary amine includes, but not limited, trimethylamine, triethylamine, pyridine.

The ratio "R" is defined herein as the flow ratio of the amount of the at least one other precursor or reagent, such as nitrogen-containing precursor, to the amount of the at least one organosilicon precursor. Thus, R is the flow rate of the at least one other reagent or precursor to the flow rate of the at least one organosilicon precursor to the deposition, or reactor chamber. For example, R can range from about 0.25 to about 20 when a nitrogen-containing precursor is added for CVD and LPCVD processes. For embodiments wherein a PECVD process is used, R is less than or equal to 1 or from about 0.25 to about 1.

In certain embodiments, the resultant silicon-based films or coatings can be exposed to a post-deposition treatment such as, but not limited to, a plasma treatment, chemical treatment, ultraviolet light exposure, electron beam exposure, and/or other treatments to affect one or more properties of the film.

Films deposited by 1,4-disilabutane demonstrate unique film properties over other known alkylsilanes. LPCVD of silicon-based films deposited with 1,4-disilabutane are primarily amorphous silicon with some carbon doping. Refractive indexes (RIs) of the films put the silicon-based films beyond the range of silicon carbides reported in the prior art such as silicon carbide deposited using 1,3-disilabutane with RI of 2.3 when deposited under same conditions while the silicon-based films employing 1,4-disilabutane have RI at around 3.2. In certain embodiments such as films deposited using LPCVD, films deposited from 1,4-disilabutane maintain a greater than 50 atomic % silicon for silicon carbide deposited from 1,4-disilabutane without ammonia or silicon carbonitride deposited from 1,4-disilabutane with ammonia. PECVD of silicon-based films deposited with 1,4-disilabutane in presence of hydrogen also exhibited greater than 50 atomic % silicon.

In another embodiment, a vessel for depositing a silicon-based film comprising at least one organosilicon precursor having at least two $SiH_3$ groups is described herein. In one particular embodiment, the vessel comprises at least one pressurizable vessel (preferably of stainless steel) fitted with the proper valves and fittings to allow the delivery of the at least one organosilicon precursor to the reactor for a CVD, a LPCVD or an ALD process. In this or other embodiments, the at least one organosilicon precursor having at least two $SiH_3$ groups is provided in a pressurizable vessel comprised of stainless steel and the purity of the precursor is 98% by weight or greater or 99.5% or greater which is suitable for the majority of semiconductor applications. In certain embodiments, such vessels can also have means for mixing the at least one organosilicon precursor with one or more additional precursor if desired. In these or other embodiments, the contents of the vessel(s) can be premixed with an additional precursor. Alternatively, the at least one organosilicon precursor and/or other precursor can be maintained in separate vessels or in a single vessel having separation means for maintaining the organoaminosilane precursor and other precursor separate during storage.

For those embodiments wherein the at least one organosilicon precursor(s) is used in a composition comprising a solvent and an at least one organosilicon precursor described herein, the solvent or mixture thereof selected does not react with the silicon precursor. The amount of solvent by weight percentage in the composition ranges from 0.5% by weight to 99.5% or from 10% by weight to 75%. In this or other embodiments, the solvent has a boiling point (b.p.) similar to the b.p. of the at least one organosilicon or the difference between the b.p. of the solvent and the b.p. of the at least one organosilicon precursor is 40° C. or less, 30° C. or less, or 20° C. or less, or 10° C. or less. Alternatively, the difference between the boiling points ranges from any one or more of the following end-points: 0, 10, 20, 30, or 40° C. Examples of suitable ranges of b.p. difference include without limitation, 0 to 40° C., 20° to 30° C., or 10° to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkane (such as octane, nonane, dodecane, ethylcyclohexane), an aromatic hydrocarbon (such as toluene, mesitylene), a tertiary aminoether (such as bis(2-dimethylaminoethyl)ether), or mixtures thereof.

As previously mentioned, the purity level of the at least one organosilicon precursor(s) is sufficiently high enough to be acceptable for reliable semiconductor manufacturing. In certain embodiments, the at least one organosilicon described herein comprise less than 2% by weight, or less than 1% by weight, or less than 0.5% by weight of one or more of the following impurities: free amines, free halides or halogen ions, and higher molecular weight species. Higher purity levels of the organosilicon precursor described herein can be obtained through one or more of the following processes: purification, adsorption, and/or distillation. The impurities of the organosilicon precursors having at least two $SiH_3$ groups can be from the raw materials used, solvent used, side-reaction, or by-products. For examples, 1,4-DSB can be prepared via either reduction of 1,1,1,4,4,4-hexachlorodisilabutane or 1,4-alkoxydisilabutane in presence of metal hydride or lithium aluminum tetrahydride in a solvent. In certain embodiments, oxygen-containing solvents such as tetrahydrofuran, gylimes or any other by-products, have to be removed via purification process to eliminate any potential oxygen incorporation into the resulting silicon-based films. In some case, the by-products can be organosilicon compounds which can be used as dopant to deposit silicon-based films.

In certain embodiments, the resultant silicon-containing films or coatings can be exposed to a post-deposition treatment such as, but not limited to, a plasma treatment, chemical treatment, ultraviolet light exposure, electron beam exposure, thermal, and/or other treatments to affect one or more properties of the film. In one particular embodiment, the silicon-based film is subjected at a thermal anneal at one or more temperatures ranging from about 500 to about 1000° C. In certain embodiments, the silicon-containing films described herein have a dielectric constant of 10 or less, 9 or less, 7 or less, 6 or less, or 5 or less. However, it is envisioned that films having other dielectric constants (e.g., higher or lower) can be formed depending upon the desired end-use of the film. An example of the silicon containing or silicon-containing film that is formed using the organosilicon precursors and methods described herein has the formulation $Si_xC_yN_z$ wherein Si ranges from about 51% to about 100% or about 55% to about 85%; C ranges from about 0% to about 50% or from about 5% to about 25%; N ranges from about 0% to about 50% or from about 0% to 25% atomic percent weight % wherein x+y+z=100 atomic weight percent, as determined for example, by XPS or other means.

The films described herein may be suitable for use as passivation layers or sacrificial layers, such as without limitation, etch stop or hermetic barriers. The films described herein can also be used in solid state electronic devices such as logic, memory, light emitting diodes (LEDs), devices planar, patterned, computer chips, optical devices, magnetic information storages, coatings on a supporting material or substrate, microelectromechanical systems (MEMS), nano-electromechanical systems, thin film transistor (TFT), and liquid crystal displays (LCD).

As mentioned previously, the method described herein may be used to deposit a silicon-containing film on at least a portion of a substrate. Examples of suitable substrates include but are not limited to, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, a flexible substrate, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The following examples illustrate the method for preparing organoaminodisilane precursors as well as depositing silicon-containing films described herein and are not intended to limit it in any way.

EXAMPLES

Example 1

Low-Pressure Chemical Vapor Deposition—LPCVD

Using a LPCVD furnace manufactured by ATV Inc of Germany, silicon-based films employing 1,4 disilabutane were deposited at various temperatures and introduced to the furnace as either a neat precursor or in the presence of ammonia. All the silicon-containing films were deposited onto medium resistivity (8-12 Ωcm) single crystal silicon wafer substrates. The data for each film deposition was summarized in Table 1 and Table 2. In the Tables, "ND" means not detected. In the following examples, thickness and optical properties such as refractive index of the films at 648 nm were performed using standard reflectometry or ellipsometry measurement system such as, for example, on a FilmTek 2000SE ellipsometer, and using well-known data fitting techniques. Typical film thickness for all above analyses ranged from about 20 to about 150 nanometers (with the exception of runs 16 and 17 wherein the film thickness was too low to perform film composition analysis). The characterization of the chemical composition of the films is accomplished using a Physical Electronics 5000VersaProbe XPS Spectrometer, which is equipped with multi-channel plate detectors (MCD) and an Al monochromatic X-ray source. The XPS data are collected using $Alk_\alpha$ X-ray excitation (25 mA and 15 kV). All density and crystallinity measurements in Table 1 were accomplished using X-ray reflectivity (XRR).

Delivery of the 1,4 disilabutane into the furnace was through vapor draw and used a mass flow controller (MFC) to meter the vapor flow. Furnace pressure during the runs varied from 200 mT to 1750 mT, with a typical chamber pressure of 1000 mT (1 T) as shown in Table 2. Typical flow rates of the 1,4 disilabutane into the furnace during depositions was typically between 10 to 33 standard cubic centimeters (sccms) as shown in Table 2.

TABLE 1

| Run # | Conditions | Wafer # | Wafer Temp (° C.) | Dep Rate (Å/min) | Refractive Index | Relative Atomic Percent | | | | |
|---|---|---|---|---|---|---|---|---|---|---|
| | | | | | | O | N | C | Si | Si/C |
| 1 | 1,4-DSB + NH₃ | 13 (center) | 500 | 5.47 | 2.82 | | | | | |
| 1 | 1,4-DSB + NH₃ | 23 (back) | 500 | 5.73 | 2.85 | | | | | |
| 2 | 1,4-DSB + NH₃ | 13 (center) | 550 | 31.25 | 3.39 | ND | 7.04 | 28.9 | 64.07 | 2.2 |
| 2 | 1,4-DSB + NH₃ | 23 (back) | 550 | 30.5 | 3.35 | ND | 7.12 | 29.69 | 63.19 | 2.1 |
| 3 | 1,4-DSB + NH₃ | 13 (center) | 525 | 14.6 | 3.09 | | | | | |
| 3 | 1,4-DSB + NH₃ | 23 (back) | 525 | 14.75 | 3.10 | | | | | |
| 4 | Pure 1,4-DSB | 13 (center) | 550 | 50.55 | 3.68 | ND | ND | 30.08 | 69.92 | 2.3 |

TABLE 1-continued

| Run # | Conditions | Wafer # | Wafer Temp (° C.) | Dep Rate (Å/min) | Refractive Index | Relative Atomic Percent | | | | |
|---|---|---|---|---|---|---|---|---|---|---|
| | | | | | | O | N | C | Si | Si/C |
| 4 | Pure 1,4-DSB | 23 (back) | 550 | 50.9 | 3.63 | ND | ND | 30.17 | 69.83 | 2.3 |
| 5 | Pure 1,4-DSB | 13 (center) | 500 | 6 | 3.07 | | | | | |
| 5 | Pure 1,4-DSB | 23 (back) | 500 | 6.7 | 3.07 | | | | | |
| 6 | Pure 1,4-DSB | 13 (center) | 500 | 6.05 | 3.44 | 1.18 | ND | 26.71 | 72.11 | 2.7 |
| 6 | Pure 1,4-DSB | 23 (back) | 500 | 6.5 | 3.42 | ND | ND | 25.58 | 74.42 | 2.9 |
| 7 | Pure 1,4-DSB | 13 (center) | 475 | 1.7 | 3.29 | | | | | |
| 7 | Pure 1,4-DSB | 23 (back) | 475 | 1.7 | 3.32 | | | | | |

Table 1 summarized the data for seven consecutive runs of 1,4-disilabutane using the ATV LPCVD furnace. For the data presented in Table 1, precursor flow of 1,4-disilabutane was kept constant at 27 sccms, the furnace temperature and deposition times varied and for some runs the deposition occurred with the addition of ammonia gas (runs 1-3). For the runs with ammonia, it was added at 20 sccms during the deposition. The furnace pressure was held constant at 1 Torr for all runs.

At 550° C., as a neat precursor, for run 4, the resulting films of 1,4-disilabutane were primarily amorphous silicon with some carbon incorporation. This was seen with the very high RI of 3.63 and 3.68, well beyond the refractive index range for silicon carbide, which is typically 2.8.

As the furnace temperature was reduced, carbon content decreased in the film and the bulk RI dropped, with the RI falling to 3.29 or 3.32 at 475° C.

Introducing ammonia caused some nitrogen incorporation into the films, although the film still remained primarily silicon-rich (e.g., having greater than 50 atomic wt. % Si) with RI ranging from 2.8 (run 1) at 500° C. to 3.50 (run 2) at 550° C.

Those results indicated that the film properties could be altered by adjusting temperature of the deposition, addition of ammonia, or both. For example, the addition of ammonia caused more nitrogen incorporation into the film and the decrease of the temperature caused less carbon incorporation into the film, yet the film still maintained greater than 50 atomic % silicon in either silicon carbide or silicon carbonitride films.

The greater than 50 atomic % silicon could be seen with the composition data provided in Table 1 wherein the atomic percents were calculated omitting hydrogen (not detectable by XPS) and were normalized to 100%. The composition of the films was measured by XPS. The results indicated the film was a primarily silicon-containing film with some carbon, or carbon and nitrogen incorporation.

Refractive index seen with the neat precursor (run 4) indicated the highly silicon rich films were not silicon carbide and XPS also demonstrated the high Si:C ratios in the films. At the temperature of 500° C., the Si:C ratio was close to 3:1 (Run 6 Table 1) which was consistent with less carbon incorporation with decrease of deposition temperature.

X-ray diffraction (XRD) showed the films to be amorphous in nature, not crystalline. Deposition with the addition of ammonia added nitrogen into the film. The final film properties could be adjusted based on the addition of ammonia and controlling deposition temperature to adjust carbon and nitrogen incorporation.

Table 2 showed the results for the second set of film depositions which examined the effect of precursor flows, furnace pressure, deposition temperature, and varying ammonia flow rates on the film composition. Referring to Table 2, film thickness for all the wafers in Table 2 were greater than 50 nm with the exception of run 16 which had no deposition and Run 17 which was 0.45 nm, too thin for XPS measurements.

TABLE 2

| Run # | Wafer Temp | 1,4-DSB (sccms) | NH₃ (sccms) | Pressure (mT) | N₂ purge (sccms) | Dep Rate (A/min) | RI | Relative Atomic Percent | | | |
|---|---|---|---|---|---|---|---|---|---|---|---|
| | | | | | | | | O | N | C | Si |
| 8 | 550 | 33 | 0 | 1000 | 0 | 49.56 | 3.58 | 1.9 | ND | 29.8 | 68.3 |
| 9 | 550 | 33 | 20 | 1000 | 0 | 28.35 | 3.39 | 1.5 | 6.9 | 29.2 | 62.5 |
| 10 | 550 | 33 | 50 | 1000 | 0 | 23.01 | 3.25 | 1.3 | 10.7 | 27.9 | 60.1 |
| 11 | 500 | 10 | 0 | 1000 | 0 | 4.28 | 3.4893 | ND | ND | 25 | 75 |
| 12 | 500 | 10 | 50 | 1000 | 0 | 1.4 | 2.53 | ND | 24.2 | 20.4 | 55.3 |
| 13 | 500 | 10 | 20 | 1000 | 0 | 2.36 | 2.82 | ND | 17.1 | 25.0 | 58 |
| 14 | 500 | 10 | 100 | 1000 | 0 | 0.75 | 2.36 | ND | 28 | 19.8 | 52.2 |
| 15 | 500 | 10 | 0 | 1750 | 0 | 2.55 | 3.48 | ND | ND | 33.7 | 66.3 |
| 16 | 500 | 10 | 0 | 250 | 0 | na | | | | | |
| 17 | 500 | 10 | 0 | 1000 | 20 | 0.23 | 2.11 | | | | |
| 18 | 500 | 10 | 0 | 1000 | 0 | 4.49 | 3.57 | ND | ND | 31.2 | 68.8 |

As shown above in Table 2, temperature had the greatest change on deposition rate. In this regard, as the deposition temperature dropped, the deposition rate slowed. Furnace pressure (run 11, 15, 16 and 18) also had some impact on the film, except with ultralow pressure of 250 mT (run 16) wherein no deposition was achieved, possibly due to the lack of resonance time for the precursor and gases in the furnace under that pressure scheme within the furnace.

Adjustment of the nitrogen content within the film could be achieved by varying the amount of ammonia to 1,4-disilabutane during deposition, that is by varying ratio R. High flows of ammonia to 1,4-disilabutane (high R) resulted in more nitrogen in the film. However, only with high ammonia to 1,4-disilabutane ratios could significant nitrogen be incorporated into the film. With a $NH_3$:1,4-disilabutane ratio R of 10 (10:1 flow rates shown as run 14 in Table 2), nitrogen reached its highest level in the deposited film with about 28% N detected by XPS. However, despite varying the amount of ammonia, silicon still remained greater than 50 atomic wt. % in the films.

Silicon films deposited with 1,4-disilabutane and ammonia still showed higher RIs than typical silicon nitrides or silicon carbides with the RI varying between 2.8 and 3.1. As with the neat precursor depositions, XPS of the deposited films still showed an extremely high silicon ratio to both carbon (2.2:1) and nitrogen (9.5:1). XRD also showed the film to be primarily amorphous silicon. Film density as measured with XRD was within expected range for low temperature CVD depositions, with densities around 7E+22 at/cc.

The X-ray photoelectron spectroscopy (XPS) was employed to analyze film composition for films deposited from 1,4-disilabutane for run numbers 2, 4, and 6 in Table 1. The spectra were curve fitted using CasaXPS with a 30% Gaussian distribution. The FWHM used was what is normal for the compound.

After the first sputter interval the number of components seen in the Si 2p region was decreased to either 1 or in some cases 2, with the Si—C component predominating, while oxygen was not present (not detected) and the nitrogen might exist as a silicon nitride of undetermined ratio. The main component in the C 1s region was very narrow. This could mean that the carbon was graphitic rather than carbidic. The FWHM of the main component in C 1s of the Run 2 sample was 1.1 eV, consistent with a carbide peak. The main component in the C 1s regions of Run 4 and Run 6 has a FWHM of 1.0 eV, which was a bit narrow for a carbide peak but also slightly wide for a graphitic peak.

Figure 1:
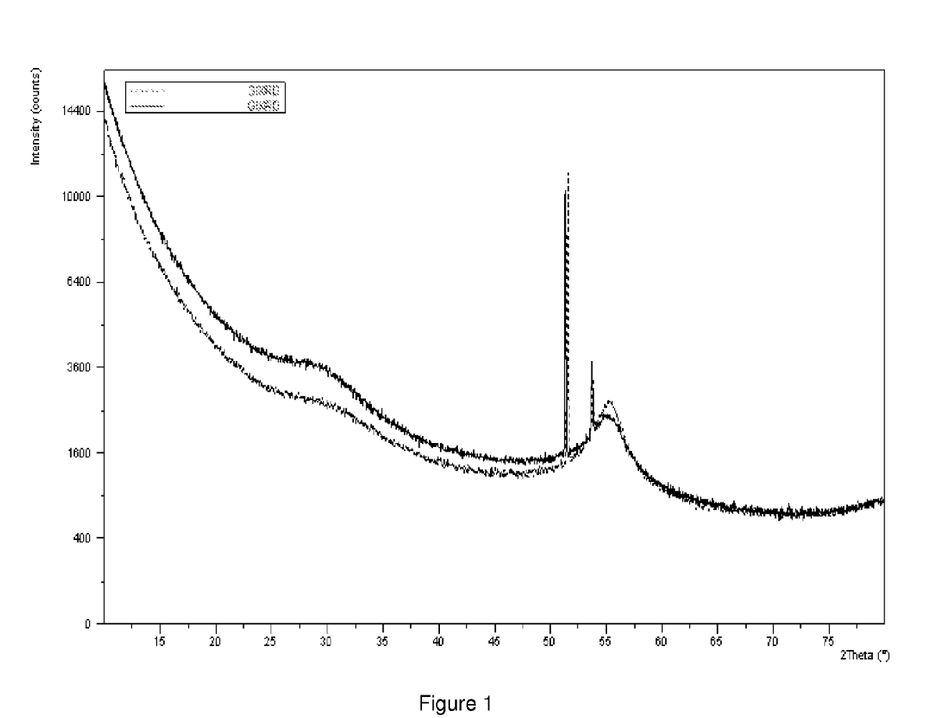
FIG. 1 is an X-ray diffraction Spectroscopy of a silicon-rich carbide film deposited from 1,4-disilabutane from run 11 in Table 2 and having properties as reported in Table 3. The dashed (lighter) curve is for the film as deposited while the solid (darker) curve is after annealing at 650° C.

FIG. 1 shows the XRD of the silicon-based film produced under run condition 11 from Table 2 which was deposited at 500° C. using 10 sccms 1,4-disilabutane. No crystalline phases were found in the film using Grazing incidence XRD, GI-XRD, indicating that the film was amorphous. Furthermore, FIG. 1 showed no crystalline SiCN, SiC, SiN, or $SiO_2$ phases present.

Table 3 showed the composition of the film used for FIG. 1 (which is also deposition run 11 on Table 2) before and after annealing by forward hydrogen scattering (FHS). Hydrogen content of the film was reduced by annealing and there was a slight change in the film density as measured by XRD. The reduction in film density indicated that the film was quite stable to thermal anneal. Further, the anneal did not generate crystalline phases. The film stability of the as deposited and the annealed film are very stable and are not susceptible to oxidation or hydrolysis. No oxygen was detected in the film either in the XPS or FHS testing after exposure to non-humidity controlled lab atmosphere.

TABLE 3

| 1,4-DSB pre-anneal (500° C. dep) Atomic Percent | | | | 1,4-DSB post 650° C. anneal (3 hrs, inert) Atomic Percent | | | |
|---|---|---|---|---|---|---|---|
| Si | C | H | Density (at/cc) | Si | C | H | Density (at/cc) |
| 61 | 20.5 | 18.5 | 7.75E+22 | 71.8 | 24.7 | 3.5 | 6.81E+22 |

The uniqueness of the films deposited from 1,4-disilabutane (1,4-DSB) was shown when compared against a film deposited with a similar silicon precursor 1,3-disilabutane (1,3-DSB) in which the two silicon atoms are linked by a methylene. When deposited under identical conditions, the films resulting from 1,3-disilabutane demonstrated more like a typical silicon carbide film and did not form primarily amorphous silicon films which is consistent with what disclosed in prior art, that is, the formation of stoichiometric silicon carbide.

Table 4 provides the direct comparison of the two films. Films deposited from 1,3-disilabutane provided a typical silicon carbide film with a RI of 2.58 whereas 1,4-disilabutane produced a predominantly silicon-rich carbide film having an RI of 3.68 under the same deposition conditions. When the two precursors were deposited with ammonia, the refractive index of the film deposited from 1,3-disilabutane was lower than typical stoichiometric silicon carbide, but the RI of the 1,4-disilabutane film was above that of silicon carbide or carbonitride, and was still silicon rich (e.g., had greater than 50 atomic wt. %) even with the nitrogen incorporation.

TABLE 4

| | Comparison of 1,4-DSB to 1,3-DSB | | | | | |
|---|---|---|---|---|---|---|
| Run Conditions | Wafer Temp. (° C.) | Precursor Flow (sccm) | $NH_3$ Flow (sccm) | Pressure (Torr) | Dep Rate (Å/min.) | Refractive Index |
| 1,4-DSB | 550 | 30 | 0 | 1 | 50.55 | 3.68 |
| 1,3-DSB | 550 | 30 | 0 | 1 | 24.8 | 2.58 |
| 1,4-DSB + $NH_3$ | 550 | 30 | 50 | 1 | 23.01 | 3.25 |
| 1,3-DSB + $NH_3$ | 550 | 30 | 50 | 1 | 12.04 | 2.24 |

Other films were deposited using the precursor 2,4-disilapentane (2,4-DSP) to compare with 1,4-disilabutane using the same deposition conditions as shown in Table 4 at a deposition temperature of 550° C. and with and without the ammonia. Unlike 1,4-disilabutane which deposited a film at 550° C. and a deposition rate above 50 Å/min, the precursor 2,4-DSP produced no film at all. When the furnace temperature was raised to 600° C., 2,4-DSP deposited around 2.61 Å/min and at 650° C. the deposition rate approached 13 Å/min. Refractive indexes of the films deposited using 2,4-DSP and 20 scams $NH_3$ were 2.18 at 600° C. and 2.15 at 650° C., respectively. The films deposited using 2,4-DSP did not produce similar film properties to those made with 1,4-DSB. This demonstrates that the organosilicon precursor having ethylene bridge between two silicon atoms tends to form silicon-based films which have better deposition behavior, film properties, or both over other precursors such as 1,3-DSB and 2,4-DSP which have methylene bridge between the two silicon atoms. Further, the refractive indices for both the 1,3-DSB and the 2,4-DSP films indicate that the atomic wt. % of silicon in the films are not greater than 50% or else these films would exhibit a higher RI.

Example 2

Plasma Enhanced Chemical Vapor Deposition—PECVD

The silicon containing films were deposited onto medium resistivity (8-12 Ωcm) single crystal silicon wafer substrates. All depositions were performed on an Applied Materials Precision 5000 system in a 200 mm DXZ chamber fitted with an Astron EX remote plasma generator, using either a silane or a TEOS process kit. The PECVD chamber was equipped with direct liquid injection delivery capability. With the exception of silane, all precursors were liquids with delivery temperatures dependent on the precursor's boiling point. Typical liquid precursor flow rates ranged from 100 to 800 mg/min; the plasma power density ranged from 0.75 to 2.5 W/cm$^2$; and the pressure ranged from 0.75-8 torr. Thickness and refractive index (RI) at 632 nm were measured by a reflectometer. Typical film thickness ranged from 100 to 1000 nm. Bonding properties hydrogen content (Si—H, C—H and N—H) of the silicon-containing films were measured and analyzed by a Nicolet transmission Fourier transform infrared spectroscopy (FTIR) tool. All density measurements were accomplished using X-ray reflectivity (XRR). X-ray Photoelectron Spectroscopy (XPS) and Rutherford Backscattering Spectrometry (RBS) analysis were performed to determine the elemental composition of the films. Wet etch rate (WER) was measured in a 10:1 Buffered Oxide Etch (BOE) solution and dilute HF (up to 5%) solution. A mercury probe was adopted for the electrical properties including dielectric constant, leakage current and breakdown field.

Organosilicon precursors were deposited using the methodology summarized below in Tables 5 and 6. Non-oxygen silicon-containing films were deposited using 1,4-disilabutane as the precursor, precursor flow from 50 to 100 sccm, NH$_3$ flow from 25 sccm to 50 sccm (H$_2$ constant at 750 sccm), chamber pressure from 2 to 6 torr, RF power (13.56 MHz) 300 to 800 W, and the deposition temperature was set at 200 and 300° C. A helium carrier flow of 300 sccm was added to all conditions.

TABLE 5

PECVD of Silicon-rich carbide using 1,4-disilabutane

| Run # | Power (W) | Pressure (Torr) | 1,4-disilabutane (sccm) | He (sccm) | H$_2$ (sccm) | Temp (° C.) | Thickness (nm) | RI @ 632 nm | Density (g/cm$^3$) | XPS Carbon (% atom) | XPS Silicon (% atom) | k |
|---|---|---|---|---|---|---|---|---|---|---|---|---|
| 1 | 600 | 2.00 | 100 | 300 | 750 | 300 | 456 | 3.13 | 2.06 | 34.0 | 66.0 | 9.71 |
| 2 | 800 | 2.00 | 100 | 300 | 750 | 300 | 459 | 3.10 | 2.08 | 31.2 | 68.8 | 9.70 |
| 3 | 800 | 4.00 | 100 | 300 | 750 | 300 | 526 | 2.99 | 2.08 | 34.7 | 65.3 | 9.48 |
| 4 | 600 | 6.00 | 100 | 300 | 750 | 300 | 519 | 2.68 | 1.85 | 38.0 | 62.0 | 8.00 |
| 5 | 800 | 6.00 | 100 | 300 | 750 | 300 | 533 | 2.79 | 1.96 | 38.3 | 61.7 | 8.63 |

In table 1, deposition run #1, the content of Si—H bond in the silicon-based film is 1.33×10$^{22}$ cm$^{-3}$ and C—H is 1.23×10$^{22}$ cm$^{-3}$. The breakdown voltage for this film is 1.9 MV/cm.

TABLE 6

PECVD of Silicon-rich carbonitride using 1,4-disilabutane

| Run # | Power (W) | Pressure (Torr) | 1,4-disilabutane (sccm) | He (sccm) | NH$_3$ (sccm) | Temp (° C.) | Thickness (nm) | RI @ 632 nm | Density (g/cm$^3$) | XPS Nitrogen (% atom) | XPS Carbon (% atom) | XPS Silicon (% atom) | k |
|---|---|---|---|---|---|---|---|---|---|---|---|---|---|
| 1 | 300 | 3.00 | 50 | 300 | 25 | 200 | 598 | 2.16 | 1.73 | 17.5 | 29.3 | 51.6 | 5.88 |
| 2 | 400 | 2.00 | 50 | 300 | 25 | 200 | 687 | 2.32 | 1.84 | 17.0 | 30.3 | 52.8 | 6.15 |
| 3 | 400 | 2.00 | 50 | 300 | 37 | 200 | 627 | 2.28 | 1.82 | 16.9 | 27.0 | 56.2 | 5.78 |
| 4 | 400 | 3.00 | 50 | 300 | 25 | 200 | 657 | 2.22 | 1.81 | 17.8 | 29.9 | 52.2 | 5.84 |
| 5 | 500 | 2.00 | 50 | 300 | 25 | 200 | 652 | 2.33 | 1.92 | 15.2 | 31.4 | 53.4 | 5.90 |
| 6 | 500 | 2.00 | 50 | 300 | 50 | 200 | 499 | 2.26 | 1.91 | 21.0 | 25.3 | 54.7 | 5.65 |
| 7 | 500 | 3.00 | 50 | 300 | 25 | 200 | 690 | 2.26 | 1.95 | 17.9 | 31.1 | 50.3 | 5.98 |
| 8 | 300 | 2.00 | 50 | 300 | 25 | 200 | 598 | 2.34 | 1.83 | 15.1 | 28.1 | 56.9 | 6.09 |
| 9 | 300 | 2.00 | 50 | 300 | 50 | 200 | 503 | 2.17 | 1.83 | 22.9 | 24.5 | 52.7 | 5.62 |
| 10 | 300 | 2.00 | 50 | 300 | 25 | 300 | 483 | 2.52 | 1.99 | 15.9 | 27.7 | 56.5 | 6.88 |
| 11 | 300 | 2.00 | 50 | 300 | 50 | 300 | 416 | 2.43 | 2.02 | 26.2 | 22.5 | 50.9 | 5.77 |
| 12 | 300 | 3.00 | 50 | 300 | 25 | 300 | 421 | 2.42 | 1.92 | 16.7 | 27.3 | 55.5 | 6.66 |
| 13 | 300 | 3.00 | 50 | 300 | 50 | 300 | 360 | 2.26 | 1.96 | 26.3 | 23.6 | 50.1 | 5.99 |
| 14 | 300 | 3.00 | 50 | 300 | 37 | 300 | 434 | 2.33 | 1.95 | 21.5 | 24.5 | 54.5 | 6.25 |
| 15 | 400 | 2.00 | 50 | 300 | 25 | 300 | 564 | 2.45 | 2.05 | 18.1 | 28.0 | 54.0 | 7.04 |
| 16 | 400 | 2.00 | 50 | 300 | 37 | 300 | 614 | 2.33 | 2.06 | 23.7 | 25.9 | 50.4 | 6.78 |
| 17 | 400 | 2.00 | 50 | 300 | 50 | 300 | 459 | 2.39 | 2.05 | 23.0 | 23.0 | 54.0 | 6.14 |
| 18 | 400 | 3.00 | 50 | 300 | 25 | 300 | 481 | 2.43 | 2.01 | 18.2 | 28.8 | 53.1 | 6.78 |
| 19 | 500 | 3.00 | 50 | 300 | 25 | 300 | 554 | 2.43 | 2.07 | 18.4 | 27.6 | 52.0 | 7.05 |
| 20 | 400 | 2.00 | 50 | 300 | 100 | 300 | 402 | 1.97 | 1.88 | 31.7 | 22.0 | 46.4 | 5.35 |

Figure 2:
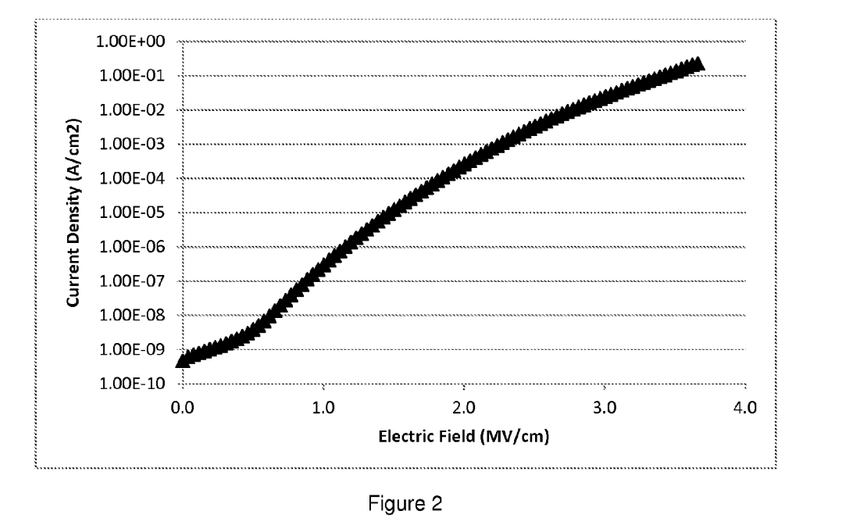
FIG. 2 is the leakage-breakdown measurement curve for a silicon-based film described herein and deposited by PECVD at 300° C.

For SiCN films, it was found that the favorable conditions for Si-rich films include lower power, lower pressure, lower ammonia flow and relatively higher temperature. For example, in deposition run #17, the content of Si—H bond is $1.74 \times 10^{22}$ cm$^{-3}$, C—H is $1.35 \times 10^{22}$ cm$^{-3}$ and N—H is $8.38 \times 10^{20}$ cm$^{-3}$ in the silicon-based film. The breakdown voltage is 3.43 MV/cm, as shown in FIG. 2. The breakdown voltage is significantly improved when compared with the SiC film in Table 5, deposition run #1 which was 1.9 MV/cm.

Thermal annealing was performed on some of the silicon-based films that were depositing using 1,4-disilabutane at a temperature of 700° C. The thermal annealing results shows that silicon-based films that had less than 50 atomic wt. % silicon were more thermally stable than silicon-based films that had greater then 50 atomic wt. % silicon. These results differ from what was seen with the LPCVD deposited silicon-based films.

As shown above in Table 6 for the PECVD depositions, a silicon content greater than 50 atomic wt. % was obtained only when the ratio between 1,4-disilabutane and NH$_3$ was equal to or higher than 1:1. Deposition run #20 shows that lower ratios yield Si-deficient SiCN films. This differs from what was seen in Example 1 for the LPCVD depositions.

The invention claimed is:

1. A method for forming a non-oxygen silicon-based film on at least one surface of a substrate, the method comprising:
providing at least one surface of the substrate in a reaction chamber;
providing at least one organosilicon precursor having at least two SiH$_3$ groups with at least one C$_{2-3}$ linkage between silicon atoms in the reaction chamber; and
forming the non-oxygen silicon-based film on the at least one surface by a deposition process selected from a group consisting of chemical vapor deposition (CVD), low pressure chemical vapor deposition (LPCVD), plasma enhanced chemical vapor deposition (PECVD), cyclic chemical vapor deposition (CCVD), plasma enhanced cyclic chemical vapor deposition (PECCVD), atomic layer deposition (ALD), and plasma enhanced atomic layer deposition (PEALD) wherein the non-oxygen silicon-based film comprises from about 51 to about 99 atomic weight percent silicon as measured by X-ray photoelectron spectroscopy (XPS).

2. The method of claim 1, wherein the at least one organosilicon precursor having at least two SiH$_3$ groups with at least one C$_{2-3}$ linkage between silicon atoms, is selected from the group consisting of:

3. The method of claim 2 wherein the at least one silicon precursor is 1,4-disilabutane.

4. The method of claim 1 wherein the deposition process in the forming step is conducted at one or more temperatures ranging from about 100° C. to 650° C.

5. The method of claim 1 wherein the non-oxygen silicon-based film is selected from the group consisting of a silicon carbide film, a silicon nitride film, and a silicon carbonitride film.

6. The method of claim 1 wherein the deposition process comprises LPCVD.

7. The method of claim 6 further comprising a step of adjusting an atomic % of carbon in the non-oxygen silicon-based film by changing the one or more temperatures of the deposition process in the forming step.

8. The method of claim 6 wherein the non-oxygen silicon-based film is an amorphous silicon-rich film.

9. The method of claim 1 wherein the deposition process comprises PECVD.

10. The method of claim 9 further comprising: providing a nitrogen-containing precursor and wherein a ratio of the amount of the nitrogen-containing precursor to the amount of at least one organosilicon precursor ranges from about 0.25 to about 1.

11. A method for forming a non-oxygen silicon-based film selected from a silicon carbide film, a silicon carbonitride film, a silicon nitride film, and an amphorous silicon-rich film on at least one surface of a substrate, the method comprising:
providing at least one surface of the substrate in a reaction chamber;
providing at least one organosilicon precursor having at least two SiH$_3$ groups with at least one C$_{2-3}$ linkage between silicon atoms in the reaction chamber; and optionally providing a nitrogen-containing precursor selected from the group consisting of ammonia, hydrazine, monoalkylhydrazine, dialkylhydrazine, primary amine, secondary amine, tertiary amine, and mixture thereof in the reaction chamber; and forming the non-oxygen silicon-based film on the at least one surface by a deposition process comprising low pressure chemical vapor deposition (LPCVD).

12. The method of claim 11, wherein the at least one organosilicon precursor having at least two SiH₃ groups with at least one C$_{2-3}$ linkage between silicon atoms, is selected from the group consisting of:

1,3-disilylcyclopentane.

13. The method of claim 12 wherein the at least one silicon precursor is 1,4-disilabutane.

14. The method of claim 11 wherein the forming step is conducted at one or more temperatures ranging from about 100° C. to 650° C.

15. The method of claim 11 wherein the method further comprises providing a nitrogen-containing precursor and wherein a ratio of the amount of the nitrogen-containing precursor to the amount of at least one organosilicon precursor ranges from about 0.25 to 20 and wherein the non-oxygen silicon based film is selected from the silicon nitride and the silicon carbonitride film.

16. The method of claim 11 wherein the non-oxygen silicon-based film comprises a silicon carbide-film.

17. The method of claim 11 wherein the non-oxygen silicon-based film is the amorphous silicon-rich film.

18. The method of claim 11 further comprising an annealing step.

19. A method for forming a non-oxygen silicon-based film on at least one surface of a substrate, the method comprising:
providing at least one surface of the substrate in a reaction chamber;
providing at least one organosilicon precursor having at least two SiH₃ groups with at least one C$_{2-3}$ linkage between silicon atoms in the reaction chamber;
optionally providing a nitrogen-containing precursor selected from the group consisting of ammonia, hydrazine, monoalkylhydrazine, dialkylhydrazine, primary amine, secondary amine, tertiary amine, and mixture thereof in the reaction chamber; and
forming the non-oxygen silicon-based film on the at least one surface by a deposition process comprising plasma enhanced chemical vapor deposition (PECVD), wherein the non-oxygen silicon-based film comprise from about 51 to about 99 atomic weight percent silicon as measured by XPS.

20. The method of claim 19 wherein reaction temperature in the reaction chamber ranges from 100° C. to 650° C.

21. The method of claim 19 comprising: providing a nitrogen-containing precursor and wherein a ratio of the amount of the nitrogen-containing precursor to the amount of at least one organosilicon precursor ranges from about 0 to about 1.

22. The method of claim 19 wherein the non-oxygen silicon-based film is selected from the group consisting of a silicon carbide film, a silicon nitride film, and a silicon carbonitride film.

* * * * *